(12) United States Patent
Zeng et al.

(10) Patent No.: US 11,415,627 B2
(45) Date of Patent: Aug. 16, 2022

(54) METHOD FOR AUTOMATICALLY TESTING PROCESSOR

(71) Applicant: AMLOGIC (SHANGHAI) CO., LTD., Shanghai (CN)

(72) Inventors: Tao Zeng, Shanghai (CN); Yong Wang, Shanghai (CN)

( * ) Notice: Subject to any disclaimer, the term of this patent is extended or adjusted under 35 U.S.C. 154(b) by 321 days.

(21) Appl. No.: 16/645,404

(22) PCT Filed: Oct. 31, 2018

(86) PCT No.: PCT/CN2018/113140
§ 371 (c)(1),
(2) Date: Mar. 6, 2020

(87) PCT Pub. No.: WO2019/091319
PCT Pub. Date: May 16, 2019

(65) Prior Publication Data
US 2020/0284838 A1    Sep. 10, 2020

(30) Foreign Application Priority Data
Nov. 7, 2017    (CN) .......................... 201711086977.X

(51) Int. Cl.
*G01R 27/28*    (2006.01)
*G01R 31/00*    (2006.01)
(Continued)

(52) U.S. Cl.
CPC .. *G01R 31/31727* (2013.01); *G01R 31/31724* (2013.01); *G06F 1/14* (2013.01)

(58) Field of Classification Search
USPC ......... 702/118, 119, 120; 716/104, 106, 108
See application file for complete search history.

(56) References Cited

U.S. PATENT DOCUMENTS 7,849,332 B1 * 12/2010 Alben ................... G06F 1/3203
713/320
8,384,406 B2 * 2/2013 Watanabe ........ G01R 31/31932
324/750.01
(Continued)

FOREIGN PATENT DOCUMENTS

CN    106201888    12/2016
CN    107101572 A  *  8/2017
(Continued)

*Primary Examiner* — Brian Ngo
(74) *Attorney, Agent, or Firm* — Clement Cheng

(57) ABSTRACT

The present invention relates to processor testing technology, specifically relating to a method for automatically testing a processor, the method comprising: S1, carrying out test preparation; S2, setting an operation voltage and a clock frequency of a processor to be tested; S3, carrying out load testing at the current operation voltage and clock frequency; S4, determining whether the processor is normal during current load testing; if yes, then turning to step S5; if no, then raising the current operation voltage by a first growth value and returning to step S2; and S5, recording an operation voltage, subject to load testing, which corresponds to the current clock frequency as a test result and determining whether the current clock frequency reaches an upper limit; if yes, then ending the operation; if no, then raising the current clock frequency by a second growth value and returning to step S2. The described method is capable of implementing the automatic testing of processors and rapidly and effectively obtaining operation voltages corresponding to clock frequencies when the processors are operating normally, and is thus suitable for a plurality of platforms.

7 Claims, 1 Drawing Sheet

(51) Int. Cl.
  *G01R 31/14* (2006.01)
  *G01R 31/317* (2006.01)
  *G06F 1/14* (2006.01)

(56) References Cited

U.S. PATENT DOCUMENTS

2010/0188115 A1* 7/2010 von Kaenel ....... H03K 19/0008
  326/16
2017/0357310 A1* 12/2017 Hovis .................... G06F 1/206

FOREIGN PATENT DOCUMENTS

| CN | 107256078 | | 10/2017 |
| CN | 107256078 A | * | 10/2017 |
| CN | 107908509 | | 4/2018 |
| JP | 2007178387 A | * | 7/2007 |

* cited by examiner

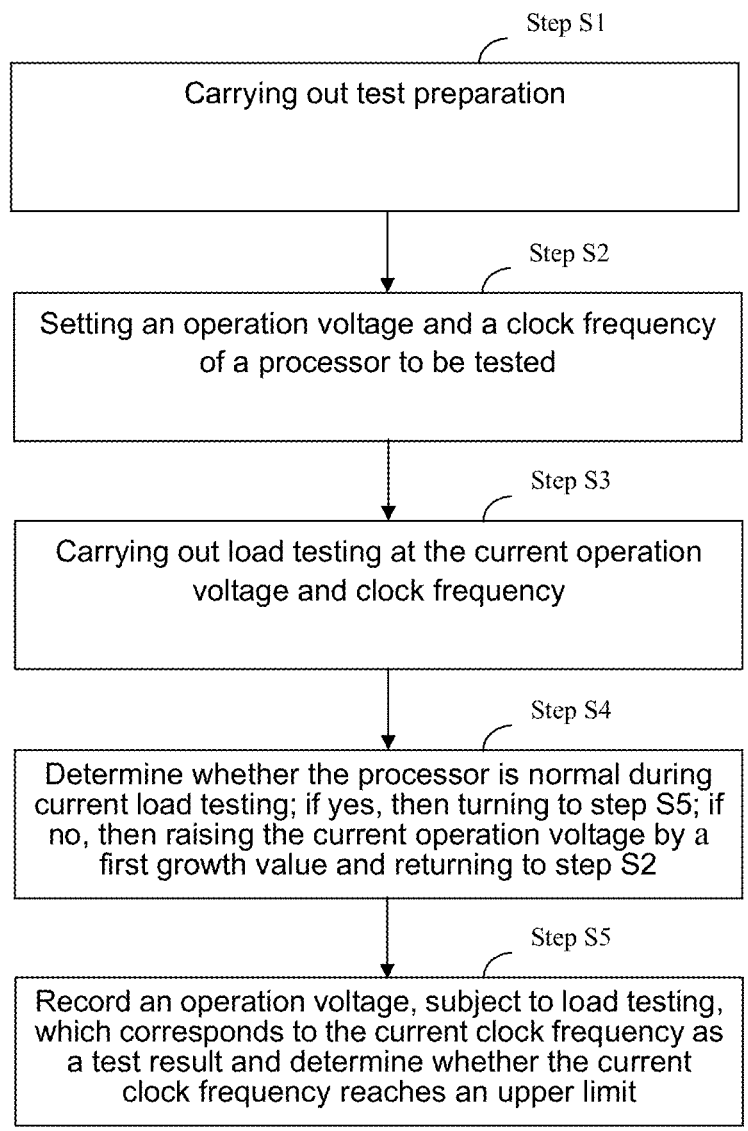

METHOD FOR AUTOMATICALLY TESTING PROCESSOR

BACKGROUND OF THE INVENTION

1. Field of the Invention

The invention relates to processor testing technology, and more particularly, to a method for automatically testing a processor.

2. Description of the Related Art

DVFS (Dynamic Voltage and Frequency System) is a very important part of an embedded system. It can dynamically regulate a voltage supplied to a core according to the frequency at which the CPU (Central Processing Unit) operates, so as to save power consumption and reduce heating. However, a table list of the operation frequency of CPU relating to the core voltage needs to be calibrated, and usually a chip design terminal will provide a reference range value. It is limited and influenced by chip tape-out process, difference among individuals and other factors. Generally, calibration is to operate a heavily loaded application on a real platform. Specifically, providing a larger and stable voltage for the core first, then stepping down the core voltage until the crash or other abnormalities occur. In this way, we can get to know a lower limit voltage at which the chip can operate stably at a fixed frequency.

However, the existing testing technology requires manual input of commands to determine the frequency, the operation voltage to be calibrated and other processes; its efficiency is lower; and misoperations may occur. It takes a longer time to complete the calibration process, and if crash occurs during the calibration process, it needs to be restarted manually so as to continue the calibration process, thus, unattended operation is impossible. Since the calibration operation is done manually, it has difficulty making deployment on multiple platforms, and the obtained results have limitations.

SUMMARY OF THE INVENTION

Aiming at the above-mentioned problems in the prior art, the present invention provides a method for automatically testing a processor, the method comprising:

step S1, carrying out test preparation;

step S2, setting an operation voltage and a clock frequency of a processor to be tested;

step S3, carrying out load testing at the current operation voltage and clock frequency;

step S4, determining whether the processor is normal during current load testing;

if yes, then turning to step S5; if no, then raising the current operation voltage by a first growth value and returning to step S2; and step S5, recording an operation voltage, subject to load testing, which corresponds to the current clock frequency as a test result and determining whether the current clock frequency reaches an upper limit;

if yes, then ending the operation; if no, then raising the current clock frequency by a second growth value and returning to step S2.

The method for automatically testing a processor further comprises:

step S6, repeating steps S1 to S5 to obtain a plurality of test results, when the plurality of test results are different, taking a test result having a maximum voltage value in the operation voltage which corresponds to each clock frequency, from the plurality of test results, as a final test result, and outputting the final test result.

In the method for automatically testing a processor, wherein each of the plurality of test results is obtained by a different test platform.

In the method for automatically testing a processor, wherein step S1 comprises:

step S11, loading and parsing a configuration file with test data;

step S12, initializing a structure of relevant test data; and step S13, obtaining a tested initial operation voltage and a tested initial clock frequency.

In the method for automatically testing a processor, wherein in step S13, obtaining the operation voltage and the clock frequency for a first test from the configuration file.

In the method for automatically testing a processor, wherein the configuration file comprises command information, test cycle information, voltage modification command information, and/or frequency modification command information.

In the method for automatically testing a processor, wherein the configuration file further comprises core parameter information of the processor.

In the method for automatically testing a processor, wherein in step S5, generating a result file derived from the test result while ending the operation.

By adopting the above-mentioned technical solutions, the present invention has the following beneficial effects: a method for automatically testing a processor is capable of implementing the automatic testing of processors, rapidly and effectively obtaining operation voltages corresponding to clock frequencies when the processors are operating normally, and is thus suitable for a plurality of platforms.

BRIEF DESCRIPTION OF THE DRAWINGS

The accompanying drawings, together with the specification, illustrate exemplary embodiments of the present disclosure, and, together with the description, serve to explain the principles of the present invention.

FIG. 1 is a flow chart showing steps of a method for automatically testing a processor according to an embodiment of the present invention.

DETAILED DESCRIPTION

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, the term "plurality" means a number greater than one.

Hereinafter, certain exemplary embodiments according to the present disclosure will be described with reference to the accompanying drawings.

In a preferred embodiment, as shown in FIG. 1, there is provided a method for automatically testing a processor, the method comprising:

step S1, carrying out test preparation;

step S2, setting an operation voltage and a clock frequency of a processor to be tested;

step S3, carrying out load testing at the current operation voltage and clock frequency;

step S4, determining whether the processor is normal during current load testing;

if yes, then turning to step S5; if no, then raising the current operation voltage by a first growth value and returning to step S2; and step S5, recording an operation voltage, subject to load testing, which corresponds to the current clock frequency as a test result and determining whether the current clock frequency reaches an upper limit;

if yes, then ending the operation; if no, then raising the current clock frequency by a second growth value and returning to step S2.

In the above-mentioned technical solution, the load testing refers to a test in which the processor is operating at a particular load; determining whether the processor is normal during current load testing. A criterion for determining whether the processor is normal during current load testing is to observe if the process crashes or other abnormalities occur when the process is operating; if no crash or other abnormalities occur, then it is determined that the processor is normal during the current load testing; otherwise, the processor is abnormal during the current load testing. Therefore, it is necessary to increase the voltage for carrying out the test. A test system for carrying out the test may be configured with a watchdog module, so as to restart the test system and continue the test process when crash and other abnormalities occur, thereby ensuring the integrality and reliability of the test process.

In a preferred embodiment, the method for automatically testing a processor further comprises:

step S6, repeating steps S1 to S5 to obtain a plurality of test results, when the plurality of test results are different, taking a test result having a maximum voltage value in the operation voltage which corresponds to each clock frequency, from the plurality of test results, as a final test result, and outputting the final test result.

In the above-mentioned technical solution, for example, carrying out multiple tests on a single platform will always lead to a plurality of test results which may be different. For example, in a first test, an operation voltage, corresponding to a clock frequency of 1.00 GHz (hertz), which obtained by a platform is 0.980 V; in a second test, due to the impact of test environment and other factors, an operation voltage corresponding to a clock frequency of 1.0 GHz is 0.990 V. In this case, the operation voltage of 0.990 V should correspond to the clock frequency of 1.0 GHz, so as to ensure the reliability of the chip during its operation.

In the above-mentioned embodiment, preferably, each of the plurality of test are obtained by different test platforms; tests are carried out on different platforms simultaneously, or stored data of test is obtained from the different platforms.

In a preferred embodiment, step S1 comprises:

step S11, loading and parsing a configuration file with test data;

step S12, initializing a structure of relevant test data; and step S13, obtaining a tested initial operation voltage and a tested initial clock frequency.

In the above-mentioned embodiment, preferably, in step S13, obtaining the operation voltage and the clock frequency for a first test from the configuration file.

In the above-mentioned embodiment, preferably, the configuration file comprises command information, test cycle information, voltage modification command information, and/or frequency modification command information.

In the above-mentioned embodiment, preferably, the configuration file further comprises core parameter information of the processor.

In a preferred embodiment, in step S5, generating a result file derived from the test result while ending the operation. The test result comprises a data list of an operation voltage corresponding to each clock frequency.

In conclusion, the present invention provides a method for automatically testing a processor, the method comprising: S1, carrying out test preparation; S2, setting an operation voltage and a clock frequency of a processor to be tested; S3, carrying out load testing at the current operation voltage and clock frequency; S4, determining whether the processor is normal during current load testing; if yes, then turning to step S5; if no, then raising the current operation voltage by a first growth value and returning to step S2; and S5, recording an operation voltage, subject to load testing, which corresponds to the current clock frequency as a test result and determining whether the current clock frequency reaches an upper limit; if yes, then ending the operation; if no, then raising the current clock frequency by a second growth value and returning to step S2. The described method is capable of implementing the automatic testing of processors and rapidly and effectively obtaining operation voltages corresponding to clock frequencies when the processors are operating normally, and is thus suitable for a plurality of platforms.

With reference to detailed description and the accompanying drawings, typical embodiments of a particular structure of the detailed description are given; while other transformation of the particular structure may be done without departing from the spirit of the present invention. Although the existing preferred embodiments are put forward in the present invention, the present invention is not limited thereto.

Variations and modifications of the present invention will be more apparent to those skilled in the art with reference to the above-mentioned detailed description. Therefore, it is intended to cover all variations and modifications within the true purpose and scope of the present invention as defined by the appended claims. Any and all the equivalents are construed to fall within the purpose and scope of the present invention.

What is claimed is:

1. A method for automatically testing a processor, the method comprising:
   step S1, carrying out test preparation;
   step S2, setting an operation voltage and a clock frequency of a processor to be tested;
   step S3, carrying out load testing at the current operation voltage and clock frequency;
   step S4, determining whether the processor is normal during current load testing;
   if yes, then turning to step S5; if no, then raising the current operation voltage by a first growth value and returning to step S2; and
   step S5, recording an operation voltage, subject to load testing, which corresponds to the current clock frequency as a test result and determining whether the current clock frequency reaches an upper limit;
   if yes, then ending the operation; if no, then raising the current clock frequency by a second growth value and returning to step S2;
   wherein step S1 comprises:
   step S11, loading and parsing a configuration file with test data;
   step S12, initializing a structure of relevant test data; and
   step S13, obtaining a tested initial operation voltage and a tested initial clock frequency.

2. The method for automatically testing a processor of claim 1, further comprising:
   step S6, repeating steps S1 to S5 to obtain a plurality of test results, when the plurality of test results are different, taking a test result having a maximum voltage value in the operation voltage which corresponds to each clock frequency, from the plurality of test results, as a final test result, and outputting the final test result.

3. The method for automatically testing a processor of claim 2, wherein each of the plurality of test results is obtained by a different test platform.

4. The method for automatically testing a processor of claim 3, wherein in step S13, obtaining the operation voltage and the clock frequency for a first test from the configuration file.

5. The method for automatically testing a processor of claim 3, wherein the configuration file comprises command information, test cycle information, voltage modification command information, and/or frequency modification command information.

6. The method for automatically testing a processor of claim 5, wherein the configuration file further comprises core parameter information of the processor.

7. The method for automatically testing a processor of claim 1, wherein in step S5, generating a result file derived from the test result while ending the operation.

* * * * *